(12) United States Patent
Murden et al.

(10) Patent No.: US 7,623,051 B2
(45) Date of Patent: Nov. 24, 2009

(54) METASTABILITY ERROR REDUCTION IN SIGNAL CONVERTER SYSTEMS

(75) Inventors: Franklin M. Murden, Roan Mountain, TN (US); Michael R. Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 56 days.

(21) Appl. No.: 12/150,659

(22) Filed: Apr. 29, 2008

(65) Prior Publication Data

US 2009/0267815 A1 Oct. 29, 2009

(51) Int. Cl.
*H03M 1/10* (2006.01)

(52) U.S. Cl. .................... 341/120; 341/155

(58) Field of Classification Search .......... 341/155, 341/120, 118, 161
See application file for complete search history.

(56) References Cited

U.S. PATENT DOCUMENTS

| | | | | |
|---|---|---|---|---|
| 4,733,220 | A | 3/1988 | Knierim | 340/347 |
| 5,012,246 | A | 4/1991 | Chung et al. | 341/160 |
| 6,060,912 | A | 5/2000 | Opris et al. | 327/57 |
| 6,346,905 | B1 | 2/2002 | Ottini et al. | 341/159 |
| 6,388,602 | B1 | 5/2002 | Yang | 341/159 |
| 6,433,725 | B1 | 8/2002 | Chen et al. | 341/155 |
| 6,480,135 | B2 | 11/2002 | Gendai | 341/159 |
| 6,603,415 | B1 | 8/2003 | Somayajula | 341/118 |
| 6,727,839 | B2 | 4/2004 | Mulder et al. | 341/165 |
| 6,876,318 | B2 | 4/2005 | Mulder et al. | 341/118 |
| 6,919,832 | B2 | 7/2005 | Brooks | 341/143 |
| 6,972,706 | B2 | 12/2005 | Snoeijs | 341/158 |
| 7,129,865 | B2 | 10/2006 | Mulder et al. | 341/118 |

OTHER PUBLICATIONS

Kester, Walt, "MT-011: Find Those Elusive Sparkle Codes and Metastable States", Tutorial MT-011, Analog Devices Inc., Norwood, MA, Jan. 5, 2006, 7 pages.
Kester, Walt, "MT-020: ADC Architectures 1: The Flash Converter", Tutorial MT-020, Analog Devices Inc., Norwood, MA, Jan. 15, 2006, 15 pages.
"Pipeline ADCs Come of Age", Application Note 634, Maxim Integrated Products, Dallas, Texass, Mar. 21, 2000, 11 pages.
Wulff, Carsten, et al.; 0.8V 1GHz Dynamic Comparator in Digital 90nm CMOS Technology; Department of Electronics and Telecommunication, Norwegian University of Science and Technology, N-7491; Nov. 21, 2005; pp. 1-4.
PCT Notification of the International Search Report and the Written Opinion of The International Searching Authority, Dated Sep. 3, 2009; for The International Application No. PCT/US2009/002217.

*Primary Examiner*—Peguy JeanPierre
(74) *Attorney, Agent, or Firm*—Koppel, Patrick, Heybl & Dawson

(57) ABSTRACT

Signal converter systems are provided which reduce degradation of system bit error rate that is caused by metastable conversion errors which generally occur when analog input signals are near reference thresholds $V_{th}$ of system comparators. When operating correctly, the comparators generate a corresponding converter code when the input signals cross the threshold. Metastability, however, may cause the comparators to fail to generate the corresponding converter code. In system embodiments, logic is provided to sense the absence of comparator decisions at the end of a predetermined decision period. In response to this absence, the system is configured to substitute the corresponding converter code. In another embodiment, the system is configured to substitute the corresponding converter code when it lies outside a predetermined digital code window.

20 Claims, 4 Drawing Sheets

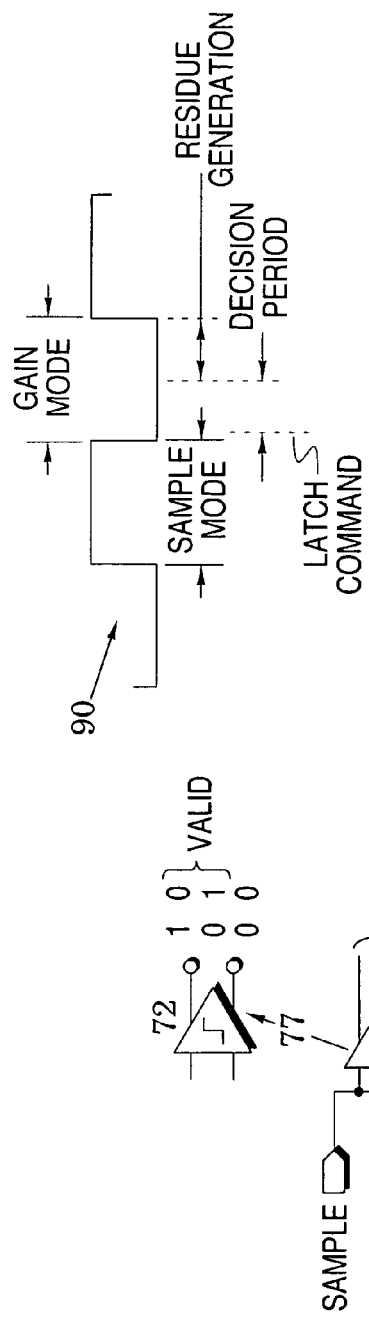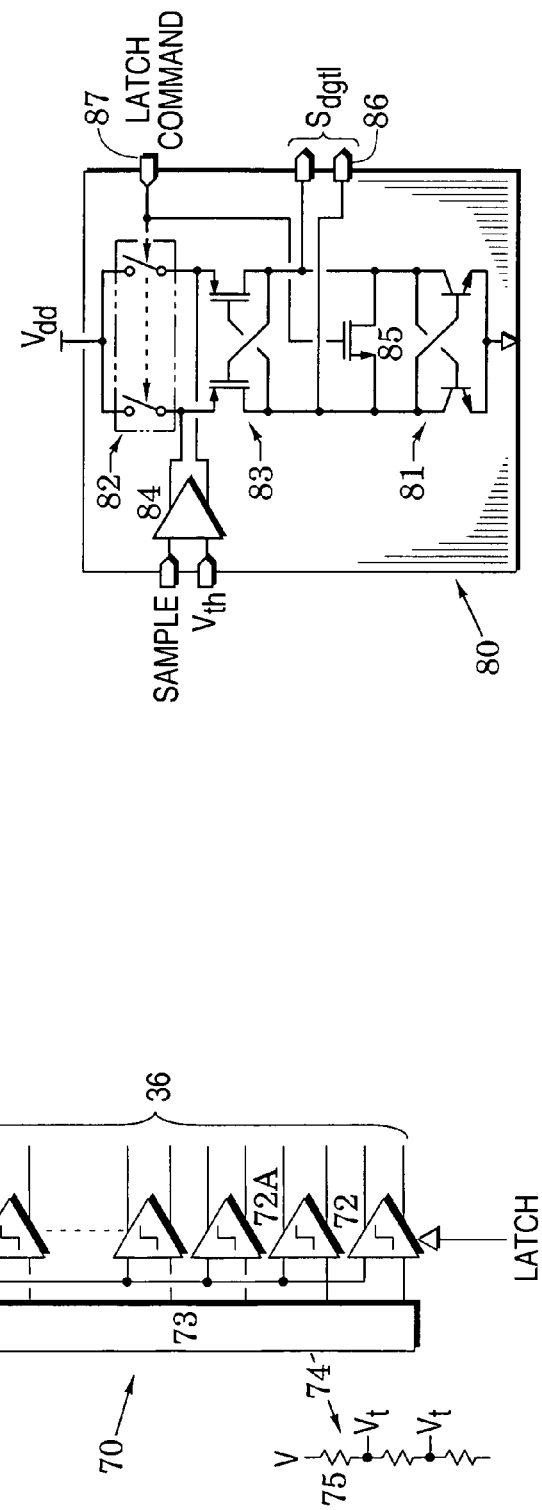

METASTABILITY ERROR REDUCTION IN SIGNAL CONVERTER SYSTEMS

BACKGROUND OF THE INVENTION

1. Field of the Invention

The present invention relates generally to pipelined converter systems.

2. Description of the Related Art

In order to convert samples of an analog input signal to corresponding output digital codes at extremely high sample rates, pipelined converter systems are often used in which each sample is processed in an initial converter stage to obtain most-significant digital bits and to form a residue signal. The residue signal is then passed to a subsequent converter stage for further processing to obtain less-significant bits.

This process may be repeated more than once until all conversion bits are obtained for the original sample. The conversion bits are then temporally aligned to produce the final digital code that corresponds to that respective sample. Although this process may extend over several sample periods, digital codes are obtained at the high converter sample rate with the stream of output digital codes somewhat delayed from the stream of analog samples To enhance conversion speed, each of the converter stages is often realized with a flash converter which comprises a bank of latch converters that each compare this stage's analog input signal to a corresponding one of a bank of reference signals during an operational regeneration mode. The latch converters are then reset during a succeeding operational reset mode.

The structure of pipelined converter systems is complex and, accordingly, they include potential sources for degradation of a system's bit error rate. Important contributions can therefore be made by discovering the sources and resolutions of these bit errors.

BRIEF SUMMARY OF THE INVENTION

The present disclosure is generally directed to structures which enhance bit error rate in pipelined converter systems. The drawings and the following description provide an enabling disclosure and the appended claims particularly point out and distinctly claim disclosed subject matter and equivalents thereof.

BRIEF DESCRIPTION OF THE DRAWINGS

FIG. 2 is a circuit diagram of a flash converter embodiment in the system of FIG. 1;

FIG. 3 is a schematic of a comparator embodiment in the flash converter of FIG. 2;

FIG. 4 is diagram of operational modes of the flash converter of FIG. 2;

DETAILED DESCRIPTION OF THE INVENTION

It has been found that conversion errors are more likely to occur when analog input signals (e.g., residue signals) are near reference thresholds $V_{th}$ in signal converter systems. It has also been found that these relationships of input signals and reference thresholds may cause associated signal comparators to enter a metastable state which delays (or even prohibits) their decisions.

As a result, the time for generation of the comparator's decision is extended and this may induce conversion errors which degrade the system's bit error rate. With these recognitions of bit error sources, converter system embodiments have been configured to sense decision failure in a comparator and, in response, substitute a predetermined digital code associated with that comparator to thereby reduced metastability errors. Converter system embodiments have also been configured to substitute the predetermined digital code only when the corresponding digital code is outside a predetermined digital code window that is spaced about the predetermined digital code.

Figure 1:
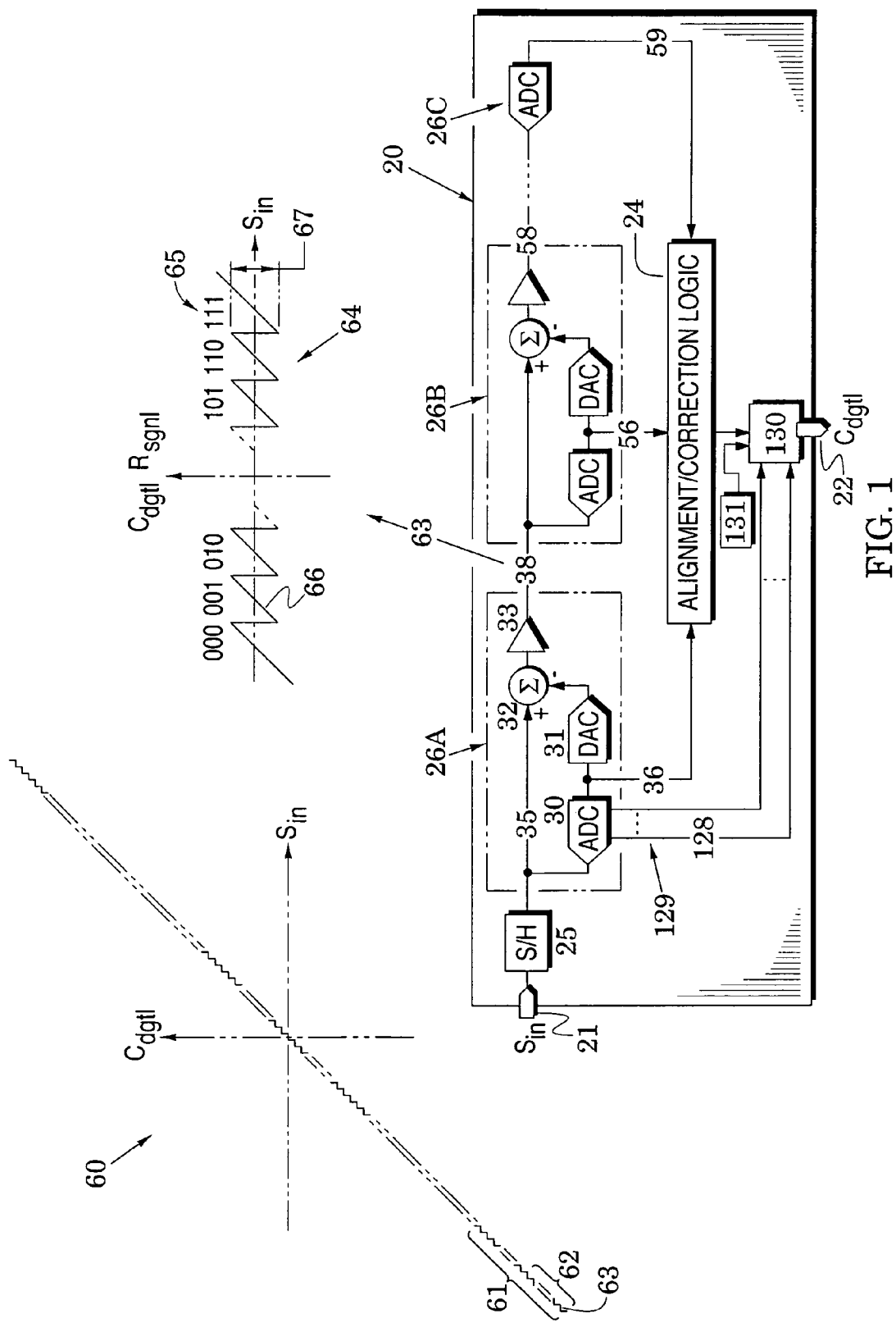
FIG. 1 is a diagram of a pipelined converter system embodiment.

Although these converter systems may be of various types (e.g., simple flash converters), FIG. 1 illustrates an exemplary signal converter system embodiment 20 in which multiple converter stages are pipelined to thereby rapidly and efficiently process each sample of successive samples of an analog input signal into respective digital bits from each of the converter stages. The system also includes an alignment/correction logic that is configured to temporally align and redundantly reduce the digital bits of the converter stages to a digital code which corresponds to the sample.

In particular, the converter system 20 converts samples of an analog input signal $S_{in}$ at an input port 21 to corresponding digital codes $C_{dgtl}$ at an output port 22. In one system embodiment, the converter 20 includes a sampler (equivalently, sample/hold (S/H)) 25 and pipelined converter stages 26A, 26B and 26C. The converter stage 26C has an analog-to-digital converter (ADC) 30, a digital-to-analog converter (DAC) 31, a summer 32 and an amplifier 33.

The sampler and the initial converter stage both operate in two modes during each period of a system clock. The sampler 25 obtains a sample 35 of the analog input signal $S_{in}$ during its sample mode and presents that sample to the initial converter stage during its hold mode. The initial converter stage 26A receives the sample during its sample mode and, during its gain mode, it converts the sample to comparator decisions 36. During its gain mode, the initial converter stage also provides a residue signal 38 to the second converter stage 26B for further processing. In particular, the ADC 30 includes a set of comparators which convert the sample 35 to the comparator decisions 36 and the DAC 31 converts these decisions to an analog signal which is subtracted from the sample 35 in the summer 32. The difference is then amplified in the amplifier 33 to generate the residue signal 38.

In a similar manner, the second converter stage 26B, in subsequent sample and gain modes, converts the residue signal 38 to comparator decisions 56 and provides a residue signal 58 to a succeeding converter stage. Although the succeeding converter stage may be a duplicate of the second converter stage 26B in some converter system embodiments, in the embodiment illustrated in FIG. 1 it is a simple ADC 26C which converts the residue signal 58 to final comparator decisions 59.

Because the generation of the comparator decisions 36 temporally preceded the generation of the comparator decisions 56 and these temporally preceded the generation of the digital bits 58, the alignment/correction logic 24 temporally delays the earlier decisions so that all can be processed to provide the final digital code 22 which corresponds to the sample that was initially provided by the sampler 25. Although there is thus a delay between each sample out of the sampler 25 and its corresponding digital code out of the alignment/correction logic, the digital code 22 is produced at the same high clock rate as that of the samples of the sampler 25.

The relationship between the analog input signal $S_{in}$ at the input port 21 and the corresponding digital code $C_{dgtl}$ at the output port 22 is shown in the digital-code transfer function 60 of FIG. 1. As described above, the initial converter stage 26A provides comparator decisions that lead to N most-significant bits of the digital code. Each combination of these most-significant bits identifies a respective one of $2^N$ segments of the transfer function as shown by a respective transfer-function segment 61 at the lower terminus of the transfer function.

As also described above, the second converter stage 26B provides comparator decisions that lead to the M next-most-significant bits of the digital code. Each combination of these next-most-significant bits identifies a respective one of $2^M$ segments of each transfer-function segment 61 of the transfer function as shown by a respective transfer-function sub-segment 62 at the lower terminus of the segment 61. The ADC 26C then provides comparator decisions that lead to the least-significant bits of the digital code. One of these least-significant bits 63 is shown at the lower terminus of the sub-segment 62.

An example arrow 63 indicates a transfer function 64 for the initial converter stage 26A which produces comparator decisions that lead to N-bit codes $C_{dgtl}$ (e.g., N=3) and a residue signal $R_{sgn}$ in response to an input signal $S_{in}$. As illustrated, the initial converter stage provides decisions that lead to bits 65 (e.g., 000, 001, 010 and so on) for increasing segments of the input signal $S_{in}$ and also generates corresponding residue signals as indicated, for example, by a transfer-function segment 66 that corresponds to a code 001.

Throughout this exemplary transfer-function segment, the comparator decisions 36 remain constant so that the DAC 31 provides a constant analog signal to the summer 32 while the amplitude of the sample 35 increases. Accordingly, the amplitude of the residue signal 38 increases linearly throughout the segment. The initial converter stage 26A is further configured to shift each transfer-function segment up or down as required to place them all within a residue window 67 for presentation to the succeeding converter stage. The initial converter stage 26A provides the appropriate decisions 36 and the corresponding residue signal 38 by the end of the stage's gain mode and is then ready to repeat the stage's sample and gain modes that have just been described.

The second converter stage 26B operates in the same manner as the initial converter stage 26A except that it operates on the residue signal 38 that was provided by the initial stage. The final stage converts the residue signal 58 of the second converter stage 26B to the converter decisions 59. At this point, it is also noted that other converter system embodiments include initial converter stages that are configured to capture samples of the input signal $S_{in}$ so that the sampler 25 is eliminated in these systems.

It is observed that various comparator irregularities (e.g., comparator offset and thermal noise) are most likely to induce comparator errors when an input signal is near a comparator's reference threshold $V_{th}$. The resultant errors may be eliminated by configuring stage converters to provide additional redundant digital bits. In particular, additional thresholds are established at each side of an original threshold and additional converters make decisions with reference to the added thresholds. These additional redundant converter decisions are sent to the alignment/correction logic 24 in FIG. 1 and used to resolve and reduce errors that may be made near reference thresholds. This resolution process leads to the final digital code that corresponds to the original sample 35 of the analog input signal $S_{in}$ at the input port 21.

It is finally noted that various error contributors (e.g., deterministic contributors and noise contributors such as clock jitter) will induce errors into the digital code $C_{dgtl}$ that is generated by the converter system 20. A measure of the inherent system bit error rate that results from all error sources may be made by applying a fixed analog input signal at the input port 21 and observing any deviations from the digital code at the output port 22 that deviates from the code which corresponds to that input. For example, a ground signal at the input port 21 should generate the corresponding digital code shown at the middle of the transfer function 60 of FIG. 1. An inherent bit error rate can then be obtained by counting the codes that differ from this corresponding digital code over a selected time period. A well-designed converter system may, for example, realize a system inherent bit error rate of $10^{-12}$ so that, on average, it generates one code error per trillion samples.

FIG. 2 illustrates an exemplary flash converter structure 70 that can be used to realize the ADCs in the converter system 20 of FIG. 1 (e.g., the ADC 30). The flash structure includes a series of latched comparators 72 that each receive a sample (e.g., the sample 35 in FIG. 1) and a respective threshold signal from a threshold generator 73. As indicated by exemplary arrow 74, the threshold generator 73 may be formed with a ladder of resistors 75 that divide a reference voltage V into threshold voltages $V_{th}$ that are each provided to a respective comparator.

In a flash embodiment indicated by an exemplary arrow 77, differential output terminals of each of the comparators are configured to provide a differential digital signal which is initially set to 00. In response to the latch signal, the output then alters to first or second digital signals 10 and 01 depending on whether the sample exceeds a reference threshold or fails to exceed this threshold. If the sample fails to exceed the threshold, the upper and lower output terminals will respectively snap to 0 and 1. If the sample exceeds the threshold, the upper and lower output terminals will respectively snap to 1 and 0. The decisions of all of the comparators forms the comparator decisions 36 that was introduced in the description of FIG. 1.

An exemplary realization of the comparators 72 is shown as the latched comparator 80 of FIG. 3 in which a second cross-coupled pair 83 of transistors is coupled between a first cross-coupled pair 81 of transistors and a switch 82. The sample and the latch's reference threshold $V_{th}$ are applied to the second pair 83 via an amplifier 84. Finally, a latch transistor 85 is coupled across the first pair 81 and the latch's differential digital output signal appears at an output port 86 which is also coupled across the first pair 81. A latch command is applied through a latch port 87 to thereby apply a supply voltage $V_{dd}$ to the second pair 83 and to turn off the latch transistor 85.

Attention is now directed to the differential digital signal out of each of the latches 72 as they would be generated by the exemplary latch 80 of FIG. 3. FIG. 4 illustrates a system clock signal 90 that may be used in the converter system 20 of FIG. 1. The clock can be used to generate alternating sample and gain modes of the converter stages. During the sample mode, the signal level at the latch port 87 in FIG. 3 is set to keep the switch 82 open and to drive the transistor 85 so that it substantially shorts together the output of the differential pairs 81 and 83. It is noted that the differential digital output signal at the port 86 is now 00 which is also shown at the output of the comparator 72 at the upper portion of FIG. 2.

When a sample is available, a converter stage enters its gain mode. This is commanded by the gain mode of the clock 90 and at this time, the latch command is applied at the port 87 in FIG. 3 to thereby close the switch 82 and to turn off the latch transistor 85. The feedback of the cross-coupled pairs 81 and 83 now acts regeneratively to make these pairs extremely sensitive to differences between the sample and the threshold signal at the amplifier 84. If the sample fails to exceed the threshold signal, the cross-coupled pairs regeneratively snap one way to provide a digital code 01 and if the sample exceeds the threshold, they regeneratively snap a different way to provide a digital code 10 as shown at the output of the comparator 72 in FIG. 2.

Depending on the particular latch structure and on other structural embodiments (e.g., that of the converter stages 26A and 26B in FIG. 1), the latch command may be applied somewhat ahead of the beginning of the gain mode or somewhat after as shown in FIG. 4. In any case, it is important that the comparator complete its regeneration within a predetermined decision period (e.g., the initial one half of the gain mode) so that other elements of the converter stages (e.g., the DAC 31, summer 32, and amplifier 33) have time in the remaining residue-generation portion of the gain mode to successfully generate the residue signal 38 that is needed by a succeeding converter stage.

Figures 5A, 5B:
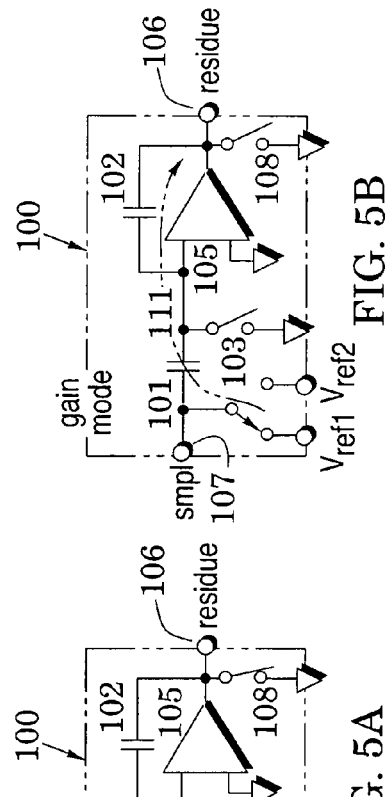
FIGS. 5A and 5B are diagrams which illustrate operational modes in an exemplary switched-capacitor multiplying digital-to-analog converter.

For example, these residue-generating elements are often realized in converter stages that include a switched-capacitor structure such as the multiplying digital-to-analog converter (MDAC) embodiment 100 shown in FIGS. 5A and 5B. This MDAC includes sample and feedback capacitors 101 and 102, first and second switches 103 and 104 and a differential amplifier 105 that drives an output port 106. The sample capacitor 101 has an upstream plate that is coupled to an input port 107 and to the second switch 104 and a downstream plate coupled to an inverting input of the differential amplifier 105. The feedback capacitor 102 is coupled about the differential amplifier 105 and an output switch 108 is coupled to the output of the differential amplifier.

In a sample operational mode shown in FIG. 5A, the first switch 103 is closed so that a current from a sample passes along a signal path 110 and is received in the sample capacitor 101. During this mode, the output of the amplifier 105 is grounded via the output switch 108. Charges from the sample are thus captured in the sample capacitor 101.

In a succeeding gain operational mode shown in FIG. 5B, the first and output switches 103 and 108 are opened and the second switch 104 is moved in response to the comparator decisions 36 of the ADC 30 in FIG. 1. In accordance with this decision, a selected one of reference voltages $V_{ref1}$ and $V_{ref2}$ is applied to the upper plate of the sample capacitor 101 to thereby move charges along the signal path 111. Charges are thus transferred from the sample capacitor to the feedback capacitor 102 to generate the residue signal at the output port 106.

If the decision portion of the gain mode in FIG. 4 becomes excessive, the residue-generation portion may not be sufficient for complete charging of the feedback capacitor 102 so that the generated residue is in error. That is, the settling time allotted to the residue-generation portion is insufficient to generate a correct residue signal. Downstream converter stages are now operation of incorrect residue signals which induces errors in the respective digital bits that they send to the alignment/correction logic 24. Accordingly, errors are inserted into the final digital code $C_{dgtl}$ at the output port 22 in FIG. 1 and these errors degrade the system's inherent bit error rate.

The disclosed converter system embodiments are realized with the recognition that the decision portion in the gain mode can become excessive when the sample signal in FIG. 2 is close to one of the voltage thresholds $V_t$. The reduced difference between the input signal and the threshold may substantially slow the regenerative action in the flash structure 80 of FIG. 3 so that the digital signal at the latch output 86 remains at 00 throughout the desired decision period and does not transition to codes 10 or 01 until later in the gain mode. In the extreme, regeneration may not occur at all and the latch output remains at 00 throughout the entire gain mode.

The comparator is said to be in a metastable state and this state can substantially extend the decision period and shorten the residue generation period. This regenerative degradation is particularly severe when the sample amplitude is low (i.e., when the amplitude of the input signal $S_{in}$ at the input port 21 of FIG. 1 is low). Because the decision portion in FIG. 4 is extended, the residue-generation portion is reduced and this may induce bit errors because the converter stage no longer has sufficient time to generate an accurate residue signal.

Figure 6:
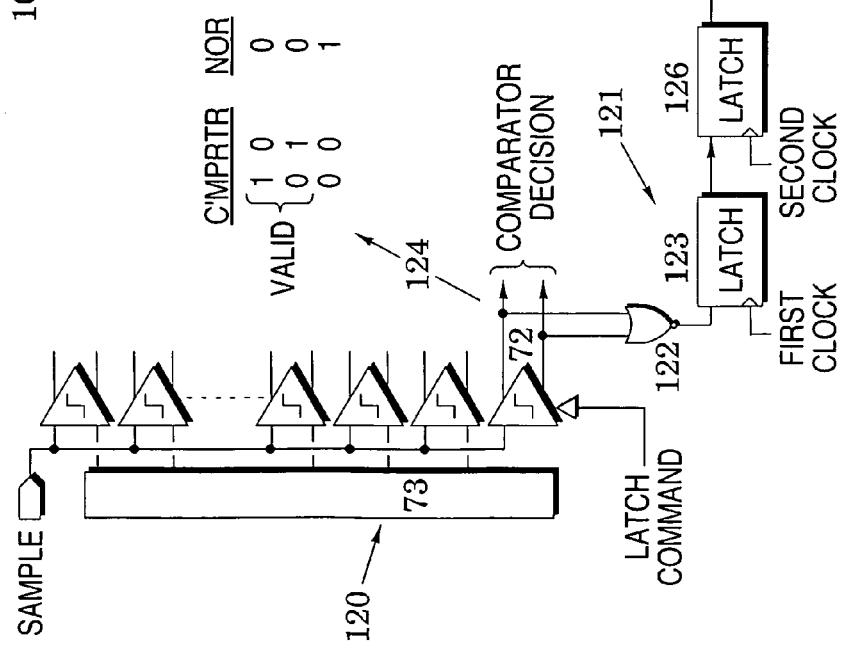
FIG. 6 illustrates a modification of the flash converter of FIG. 2.

To eliminate or reduce this source of bit error rate degradation, FIG. 6 repeats illustrates a flash converter 120 which comprises the converter structure 70 of FIG. 2 with one of the converter's comparators 72 supplemented by a metastability detector 121. Although a detector is preferably applied to each of the comparators, only one is shown for simplicity of illustration. In this detector, a logic gate 122 is coupled to sense an absence of the first and second differential latch signals at the end of the predetermined decision period and, in response, signal the alignment/correction logic 24 in FIG. 1 to substitute a predetermined digital code for the digital code that would otherwise be produced.

The detector 121 also includes a latch 123 that monitors the output of the gate 122. The gate 122 is coupled across the differential output of a comparator 72 and the output of the gate is coupled to drive the latch. It is noted that detectors can be applied to any converter stage but is most effective when applied to stages (e.g., the initial converter stage 26A in FIG. 1) whose conversion errors are most significant.

A signal arrow 124 indicates valid (and invalid) comparator states along with corresponding outputs of the gate 122. Application of the gate can be examined with aid of FIG. 7 which illustrates a system clock signal 91 that is similar to that of FIG. 4 but identifies a desired decision period 125 with cross hatching and indicates a first clock which occurs at the end of this decision period. The decision period 125 is determined so that if one of the valid first and second differential latch decisions 10 and 01 is provided within this period, an associated MDAC (e.g., the MDAC of FIGS. 5A and 5B) will have enough settling time to generate an accurate residue signal. If these decisions are delayed past the decision period 125, the resultant residue signal may be in error as will also be the final digital code. As a result the converter system's inherent bit error rate will be degraded.

Figure 7:
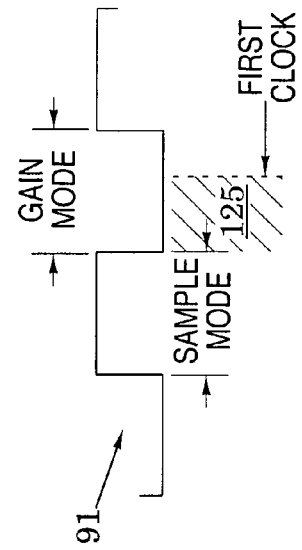
FIG. 7 is a variation of the diagram of FIG. 4 that facilitates description of the modification of FIG. 6.

As shown in FIG. 7, the first clock is applied to the latch 123 at the end of the decision period 125. If the output of the comparator 72 is either of the valid states 10 or 01, the NOR gate will not identify an absence of these valid states and no change will be made to the generation of the final digital code at the output port 22 in FIG. 1. If the output of the comparator 72 is still 00, however, this indicates that the comparator 72 has not yet made a decision. As described above, this will occur when the sample is near the respective threshold and is more likely to occur when the sample amplitude is low. When the latch 123 interrogates the gate 122, a high signal will be sent as a correction command to alter the digital code generated by the alignment/correction logic (24 in FIG. 1).

When this condition occurs at a threshold of the initial converter stage, an error is especially significant. If the initial converter stage is a three-bit stage and the final digital code at the output port 22 is twelve bits, for example, the thresholds of the initial stage differ by 512 codes which could also be a measure of the extent of the error. With the command from the latch 123, however, the correct code is substituted. If the threshold is the one associated with the lowest comparator 72A in FIG. 2, for example, the alignment/correction logic will substitute a digital code that begins with 010 and continues with all 0's. That is, the predetermined digital code is the system code associated with that comparator (and threshold) in which the absence is sensed.

This command decision on the present sample must be passed on before the next clock period because the gate 122 and latch 123 must be available for a subsequent decision on the succeeding sample. Therefore, additional latches are provided to pass on the correction command. Each additional clock and latch corresponds to a converter stage successive to the one in which the absence was sensed. Sometime during the succeeding sample mode, therefore, a second clock is applied to a second latch 126 so that the command decision is now shifted to its output. This process continues until a last latch 127 responds to an Nth clock which reports a correction command 128. The Nth clock corresponds to the last converter stage (e.g., the converter stage 26C in FIG. 1.

FIG. 1 illustrates that the correction command 128 in FIG. 6 is one of a set 129 of correction commands wherein each of the other commands corresponds to a respective one of the other comparators of the ADC 30. As an example of the other commands, the correction command 128 is sent to control a logic switch 130 which also receives the digital code generated by the alignment/correction logic 24. A digital memory 131 (e.g., a programmable gate array) is programmed to provide the predetermined digital code that was described above as the system code associated with the comparator in which the absence of valid states was sensed.

In operation of the converter system 20 of FIG. 1, the digital code from the alignment/correction logic 24 passes to the output port 22 in the absence of the correction command 128. If the correction command 128 is present, however, the switch 130 substitutes the predetermined digital code of the memory 131.

The predetermined digital code in the memory 131 may be altered to also correct other conversion errors of the converter system 20. For example, measurements on the system may provide offset errors which document that particular ones of the comparators 72 of FIG. 6 change states in response to an analog input signal that is offset from the intended analog input signal. Therefore, the predetermined digital code may also be altered to an appropriately-corrected digital code (i.e., a code that includes the effect on the code of the offset error). This corrected digital code is stored in the memory 131 so that the altered code is provided at the output port 22. The converter system 20 of FIG. 1 thus not only corrects errors in the digital code at its output port 22 that are generated by metastable comparators but also corrects measured errors such as comparator offset errors.

It is important that the metastability detector 121 of FIG. 6 not interfere with normal comparator action. To insure that the latch 122 does not interrogate the NOR gate 121 during a normal regeneration period of the associated comparator, the first clock in FIG. 7 should be sufficiently delayed so that regeneration will be normally completed prior to this clock. Consideration must be taken, however, of situations in which comparator regeneration completes just prior to the first clock. Generation of an accurate residue must now be completed in the remainder of the gain mode and, if the remaining time is insufficient, regeneration will not be complete and a bit error will occur.

In general, therefore, the first clock is positioned so that comparator regeneration which occurs just prior to the first clock leaves sufficient settling time so that residue generation is accurate and the inherent bit error rate of the converter system is not degraded. As previously described, this inherent bit error rate may be established by measurement. Alternatively, a desired bit error rate may be established by determining a bit error rate associated with a selected level (e.g., the 5 or 6 sigma level of Gaussian distributed noise) of system noise.

Figure 8:
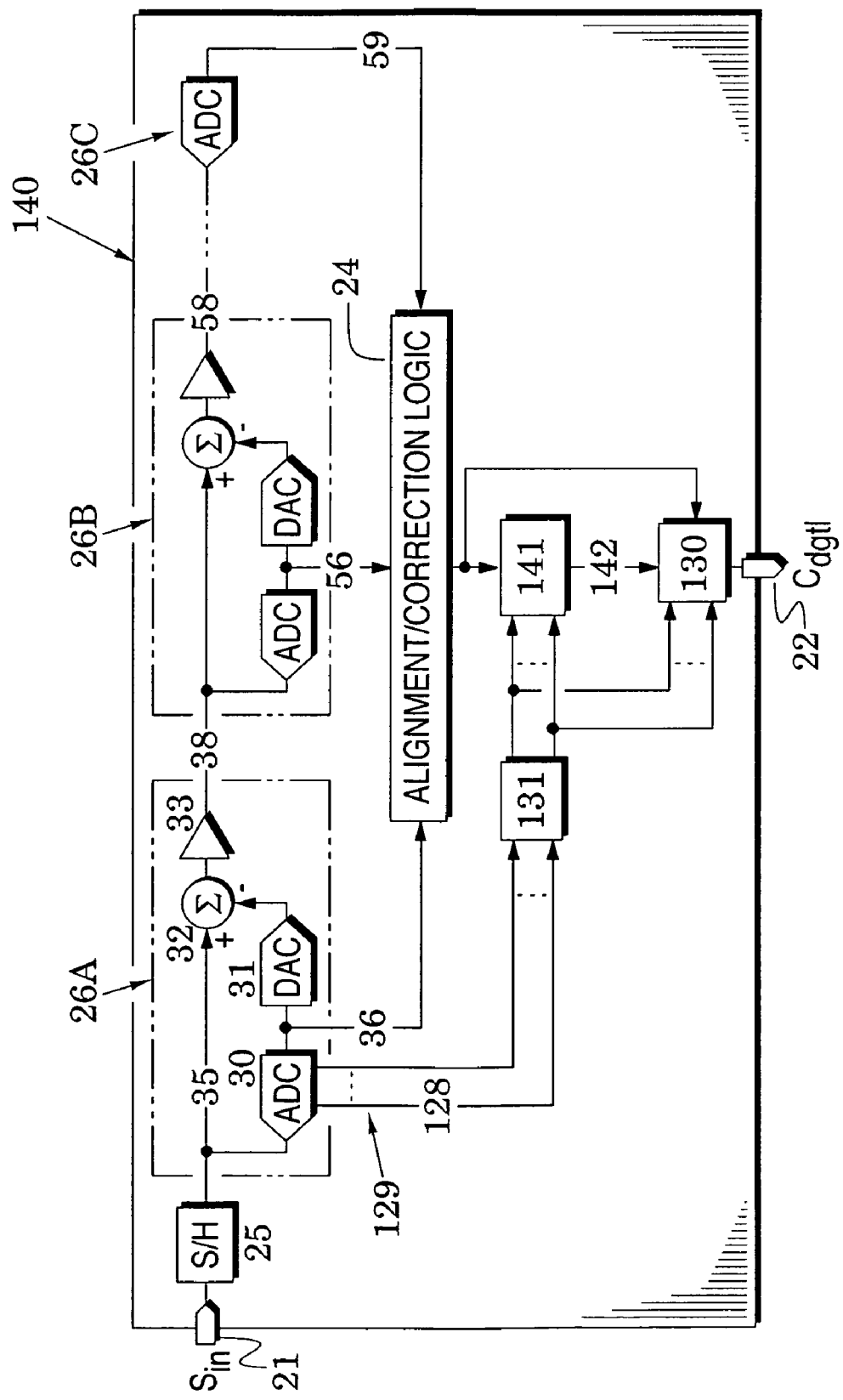
FIG. 8 is a diagram of another pipelined converter system embodiment associated with the modification of FIG. 6.

FIG. 8 illustrates another signal converter system embodiment 140 that includes elements of the system 20 of FIG. 1 with like elements indicated by like reference numbers. In contrast, however, the system 140 includes a digital comparator 141 which is inserted ahead of the digital switch 130 of FIG. 1. In addition, the set 129 of correction commands 128 is directed to the memory 131 which, in response, provides a digital code window to the comparator 141 and provides the predetermined digital code to the switch 130.

Operation of the system 140 can be examined with reference to the correction command 128 that was generated in FIG. 6. As previously described, the correction command was generated when the amplitude of the input sample to the comparator 72 crossed the level of the comparator's threshold but the output state of the comparator remained at 00 because feedback in the comparator failed to urge it to either of the valid states 01 and 10. In the absence of the valid states, the NOR gate 122 initiated a correction command 128 at the time of the first clock.

Using the previous example wherein the initial converter stage is a three-bit stage and the final digital code at the output port 22 is twelve bits, the digital code that corresponds to this comparator's threshold is 512. In the system 140 of FIG. 8, this corresponding digital code is stored in the memory 131 along with a predetermined code window. For exemplary purposes, it can be assumed that the code window extends 32 codes (equivalent to 5 bits) below and above the corresponding digital code 512. That is, the predetermined code window extends from code 480 to code 544.

In response to the correction command 128, the memory 131 provides this code window to the comparator 141 and provides the corresponding digital code to the switch 130. The digital comparator 141 is configured to issue a switch command 142 that causes the switch 130 to route the digital code from the alignment/correction logic 24 to the output port 22 if it is within the code window and to route the corresponding digital code 512 from the memory 131 to the output port otherwise.

Attention was directed above to situations in which comparator regeneration occurs just prior to the first clock in FIG. 7. If the position of the first clock does not leave sufficient time to insure generation of an accurate residue, errors are introduced into the system's digital code at the output port 22. The system's error rate is thus sensitive to the positioning of the first clock. This sensitivity is reduced in the system 140 of FIG. 8 because the corresponding digital code from the alignment/correction logic 24 will only be replaced by the predetermined digital code if it is outside the predetermined code window.

The width of the predetermined code window can be set so that it permits acceptable errors, e.g., errors within the inherent bit error rate of the system. Although various widths can be selected, an upper bound for the code window might be a code width that does not exceed the code width between adjacent ones of the stage thresholds, e.g., the thresholds in the system 120 of FIG. 6.

Although converter system embodiments have been illustrated in the context of a pipelined converter system 20, it is to be understood that other systems may use the described teachings. For example, the teachings may be used with simple flash converter systems such as those shown in FIGS. 2 and 6.

The embodiments of the invention described herein are exemplary and numerous modifications, variations and rearrangements can be readily envisioned to achieve substantially equivalent results, all of which are intended to be embraced within the spirit and scope of the appended claims.

We claim:

1. A method of converting an analog signal to a digital code, comprising the steps of:
for each threshold of a set of thresholds,
a) generating first and second differential digital signals when said analog signal has respectively exceeded said threshold and failed to exceed said threshold; and
b) initiating a correction command in response to the absence of said first and second differential signals at the end of a predetermined decision period; and
forming a corresponding digital code from said differential digital signals.

2. The method of claim 1, further including the step of substituting, in response to said correction command, a predetermined digital code for said corresponding digital code.

3. The method of claim 2, wherein said predetermined digital code is a code that corresponds to the threshold associated with said initiating step.

4. The method of claim 1, wherein said first and second differential signals are generated by a latched comparator.

5. The method of claim 1, further including the step of substituting, in response to said correction command, a predetermined digital code when said corresponding digital code is outside a predetermined digital code window that includes said predetermined digital code.

6. The method of claim 5, wherein said predetermined digital code is a code that corresponds to the threshold associated with said initiating step.

7. The method of claim 5, wherein said predetermined digital code lies at the center of said digital code window.

8. The method of claim 5, wherein said digital code window has a code width that does not exceed the code width between adjacent ones of said thresholds.

9. An analog-to-digital converter system, comprising:
a set of comparators to provide, in response to an analog signal, a corresponding digital code wherein each of said comparators provides first and second differential digital signals when said analog signal has respectively exceeded a respective threshold and failed to exceed said threshold; and
for each of said comparators, a logic gate coupled to initiate a correction command in response to the absence of said first and second differential signals at the end of a predetermined decision period.

10. The system of claim 9, further including, to respond to said correction command, a logic substitution circuit configured to substitute a predetermined digital code for said corresponding digital code.

11. The system of claim 10, wherein said logic substitution circuit includes:
a memory to provide said predetermined digital code; and
a digital switch to select between said corresponding digital code and said predetermined digital code.

12. The system of claim 10, wherein said predetermined digital code is a digital code associated with the threshold of the comparator in which said absence is sensed.

13. The system of claim 9, further including, to respond to said correction command, a logic substitution circuit configured to substitute a predetermined digital code when said corresponding digital code is outside a predetermined digital code window.

14. The system of claim 13, wherein said logic substitution circuit includes a comparator to determine when said corresponding digital code is outside said predetermined digital code window.

15. The system of claim 14, wherein said logic substitution circuit includes;
a memory to hold said predetermined digital code and said predetermined digital code window; and
a digital switch to select between said corresponding digital code and said predetermined digital code.

16. The system of claim 9, further including, to respond to said correction command, a logic substitution circuit configured to substitute a predetermined digital code when said corresponding digital code is outside a predetermined digital code window wherein said predetermined digital code is a digital code associated with the threshold of the comparator in which said absence is sensed.

17. The system of claim 16, wherein said logic substitution circuit includes:
a comparator to determine when said corresponding digital code is outside said predetermined digital code window;
a memory to hold said predetermined digital code and said predetermined digital code window; and
a digital switch to select between said corresponding digital code and said predetermined digital code.

18. An analog-to-digital converter system, comprising:
converter stages wherein:
an initial one of said converter stages is configured to process each sample of successive samples of an analog input signal into respective digital bits and provide a corresponding residue signal; and
the remainder of said converter stages are configured to process the residue signal of the preceding one of said stages into respective digital bits and, if not the last of said converter stages, provide a corresponding residue signal; and
an alignment/correction logic configured to temporally align and redundantly reduce said digital bits to a corresponding digital code that corresponds to said sample;
wherein said initial converter stage comprises:
a set of comparators to provide, in response to an analog signal, said digital bits wherein each of said comparators provides first and second differential digital signals when said analog signal has respectively exceeded a respective threshold and failed to exceed said threshold; and
for each of said comparators, a logic gate coupled to initiate a correction command in response to the absence of said first and second differential signals at the end of a predetermined decision period.

19. The system of claim 18, further including, to respond to said correction command, a logic substitution circuit configured to substitute a predetermined digital code for said corresponding digital code wherein said predetermined digital code is a digital code associated with the threshold of the comparator in which said absence is sensed.

20. The system of claim 19, wherein said logic substitution circuit includes:
a memory to provide said predetermined digital code; and
a digital switch to select between said corresponding digital code and said predetermined digital code.

* * * * *